US006614302B2

United States Patent
Abe

(10) Patent No.: US 6,614,302 B2
(45) Date of Patent: Sep. 2, 2003

(54) CMOS OPERATIONAL AMPLIFIER CIRCUIT

(75) Inventor: Shinichi Abe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/091,449

(22) Filed: Mar. 7, 2002

(65) Prior Publication Data
US 2002/0125950 A1 Sep. 12, 2002

(30) Foreign Application Priority Data

Mar. 12, 2001 (JP) ........................................ 2001-068316

(51) Int. Cl.[7] .............................................. H03F 3/45
(52) U.S. Cl. ...................................... 330/253; 330/257
(58) Field of Search ................................. 330/253, 257

(56) References Cited

U.S. PATENT DOCUMENTS 5,610,557 A * 3/1997 Jett, Jr. ....................... 330/261
6,194,962 B1 * 2/2001 Chen .......................... 330/253
6,194,966 B1 * 2/2001 Dasgupta ................... 330/253

FOREIGN PATENT DOCUMENTS

JP 3-62712 3/1991

* cited by examiner

Primary Examiner—Robert Pascal
Assistant Examiner—Khanh Van Nguyen
(74) Attorney, Agent, or Firm—Mattingly, Stanger & Malur, P.C.

(57) ABSTRACT

A CMOS operational amplification circuit is provided with a first differential amplifier having differential MOS transistors of one of P channel and N channel which receive an input signal; a second differential amplifier having differential MOS transistors of the other of P channel and N channel which receive the input signal; a current mirror circuit which receives respective current output signals of the first and second differential amplifiers and generates a current output signal depending on the current values of the respective current output signals; an output circuit which receives the output signal of the current mirror circuit and generates an output signal depending on the input signal; and a change-over circuit. The change-over circuit causes operation change-over which causes the first differential amplifier to perform operation, further causes the first differential amplifier to stop operation when the first differential amplifier is entering or has been entered into a dead zone operation region with respect to the input signal and causes the second differential amplifier to perform operation.

10 Claims, 2 Drawing Sheets

CMOS OPERATIONAL AMPLIFIER CIRCUIT

BACKGROUND OF THE INVENTION

1. Field of the Invention

The present invention relates to a CMOS operational amplifier circuit, and more specifically relates a CMOS operational amplifier circuit which can use a broad input and output voltage range under a low voltage drive, permits a highly accurate amplification and is particularly suitable for use as a comparator circuit.

2. Background Art

A CMOS operational amplifier circuit is used in a system IC in which analogue signals and digital signals exist in a mixed manner and is suitable for when used as an amplifier circuit or a comparator circuit of a microscopic current in an order of $\mu A$.

This sort of circuit usually includes as its input stage a differential amplifier having a pair of P channel MOS transistors or a pair of N channel MOS transistors and is constituted so as to transfer an output current from the differential amplifier to an output side through a current mirror circuit. However, in this sort of circuit, since there is a dead zone corresponding to a source-gate threshold voltage in the MOS transistors with respect to the same phase input, an input and output voltage in the range from the ground GND to a power source voltage VDD can not be fully used, and the dynamic range of the input and output voltage is limited.

As a measure for resolving the above problem, JP-A-3-62712 (1991) discloses a "CMOS operational amplifier circuit" in which a differential amplifier of P channel MOS transistors and another differential amplifier of N channel MOS transistors are provided at the input stage thereof.

In the disclosed circuit the differential amplifier of P channel MOS transistors and the differential amplifier of N channel MOS transistors provided as the input stage are driven at the same time by an input signal and their respective output currents are synthesized by a current mirror circuit. Thereby, in the disclosed circuit when one of the differential amplifiers of P channel MOS transistor and N channel MOS transistors is moved into its dead zone, an output of the other differential amplifier is obtained, thereby, an output substantially eliminating a dead zone is provided and a broad input and output voltage dynamic range from the ground GND to the power source voltage VDD is ensured.

With such CMOS operational amplifier circuit in which the differential amplifiers of P channel transistors and N channel transistors are provided and are driven at the same time, when the differential amplifier of P channel MOS transistor is placed in its dead zone, only the differential amplifier of N channel MOS transistors is operated, on the other hand, when the differential amplifier of N channel MOS transistors is placed in its dead zone, only the differential amplifier of P channel MOS transistors is operated. In the region excluding both dead zones both differential amplifiers are operated.

Therefore, when assuming, for example, that the power source voltage VDD is 1.8V, the dead zone voltage of N channel and P channel MOS transistors with respect to an input signal is 0.7V, a transconductance Gm of the differential amplifier of N channel MOS transistors is GmN and a transconductance Gm of the differential amplifier of P channel MOS transistors is GmP, a transconductance Gm of the CMOS operational amplifier circuit is given as Gm=GmP when the input signal voltage is in a range of 0~0.7V, when the input signal voltage is in a range of 0.7~1.1V, the transconductance Gm thereof is given as Gm=GmN+GmP and when the input signal voltage is in a range of 1.1V~1.8V, the transconductance Gm thereof is given as Gm=GmN, thus, the transconductance Gm thereof varies depending on the input signal voltage. As a result, the gain bandwidth product (GB product) varies.

In such CMOS operational amplifier circuit the differential amplifiers which are operative differ depending on the input signal voltage and since the differential amplifiers are separately operated in the three operation ranges, and the GB product varies largely depending on the input signal voltage. As a result, selection of an optimum phase compensation capacitor is made difficult. Because of the difficulty of selecting such phase compensation capacitor, a problem is caused that the operational amplifier circuit is likely to be oscillated. Further, in the CMOS operational amplifier circuit having the above structure, since large steps with regard to the transconductance Gm before and after both dead zones are caused under a low power source voltage, another problem arises that a highly accurate amplification is prevented.

SUMMARY OF THE INVENTION

The present invention is intended to solve such conventional art problems and an object of the present invention is to provide a CMOS operational amplifier circuit which is suitable for a low voltage drive, can use a broad input and output voltage range and permits amplification with high accuracy.

A structure of a CMOS operational amplifier circuit according to a first aspect of the present invention which achieves the above object comprises a first differential amplifier having differential MOS transistors of one of P channel and N channel which receive an input signal and a second differential amplifier having differential MOS transistors of the other of P channel and N channel which receive the input signal and generates an output signal depending on the input signal in response to an output of these differential amplifiers, further comprises a current mirror circuit which receives respective current output signals of the first and second differential amplifiers and generates a current output signal depending on the current values of the respective current output signals, an output circuit which receives the output signal of the current mirror circuit and generates an output signal depending on the input signal and a change-over circuit for causing operation change-over which causes the first differential amplifier to stop operation when the first differential amplifier is entering or has been entered into a dead zone operation region with respect to the input signal and causes the second differential amplifier to perform operation.

Further, the structure of a CMOS operational amplifier circuit according to a second aspect of the present invention comprises a first bias current producing circuit which causes to flow a first current having the value corresponding to a bias current value of a differential transistor in the first differential amplifier and a second bias current producing circuit which causes to flow a second current having the value corresponding to a bias current value of a differential transistor in the second differential amplifier, wherein when the bias current flowing through the differential transistor in the first differential amplifier is caused to flow through or to be sinked in the current mirror circuit and when the bias current flowing through the differential transistor in the second differential amplifier is caused to flow through or to be sinked into the current mirror circuit, the current output signals of the first and second differential amplifiers are inputted, and the change-over circuit causes the first differential amplifier to operate as well as to flow the second current value from the second bias current producing circuit to the current mirror circuit or to sink the same from the current mirror circuit and when the first differential amplifier is entering or has entered into the dead zone operation region with respect to the input signal, the change-over circuit causes to stop the first differential amplifier to operate and the second current value from the second bias current producing circuit to flow, and causes to operate the second differential amplifier as well as causes to flow the first current value from the first bias current producing circuit to the current mirror circuit or causes to sink the same from the current mirror circuit.

Now, according to the first aspect of the present invention, through the provision of the change-over circuit, the first differential amplifier is caused to operate, and when the first differential amplifier is entering or has entered into the dead zone operation region with respect to the input signal, the operation of the first differential amplifier is stopped and the second differential amplifier is caused to be operated. Thereby, the transconductance Gm of the CMOS operational amplifier circuit assumes either one of that for the first and second differential amplifiers and variation of Gm with respect to the input signal is suppressed. Further, it is easy to design the first and second differential amplifier to have substantially the same Gm.

Therefore, variation of Gm with respect to the voltage variation of the input signal of thus constituted CMOS operational amplifier circuit is very small.

Further, according to the second aspect of the present invention, through the provision of the first and second bias current producing circuits which produce the respective bias currents for the differential transistors in the first and second differential amplifiers, since when one of the differential amplifiers is operating, the bias current of the other differential amplifier is supplied from the concerned bias current producing circuit to the current mirror circuit or a bias current is caused to flow out from a power source which flows the bias current to the current mirror circuit to the bias current producing circuit, even if an operation change-over between the first and second differential amplifiers is performed, the bias current in the current mirror circuit is kept to be hardly varied. As a result, the transconductance Gm of the current mirror circuit which receives the current outputs of the first and second differential amplifiers is substantially kept constant.

Accordingly, variation of the transconductance Gm of the CMOS operational amplifier circuit can be further suppressed.

As a result, a CMOS operational amplifier circuit can be easily realized which is suitable for a low voltage drive, can use a broad input and output voltage range and permits amplification with high accuracy.

DESCRIPTION OF THE PREFERRED EMBODIMENTS

Figure 1:
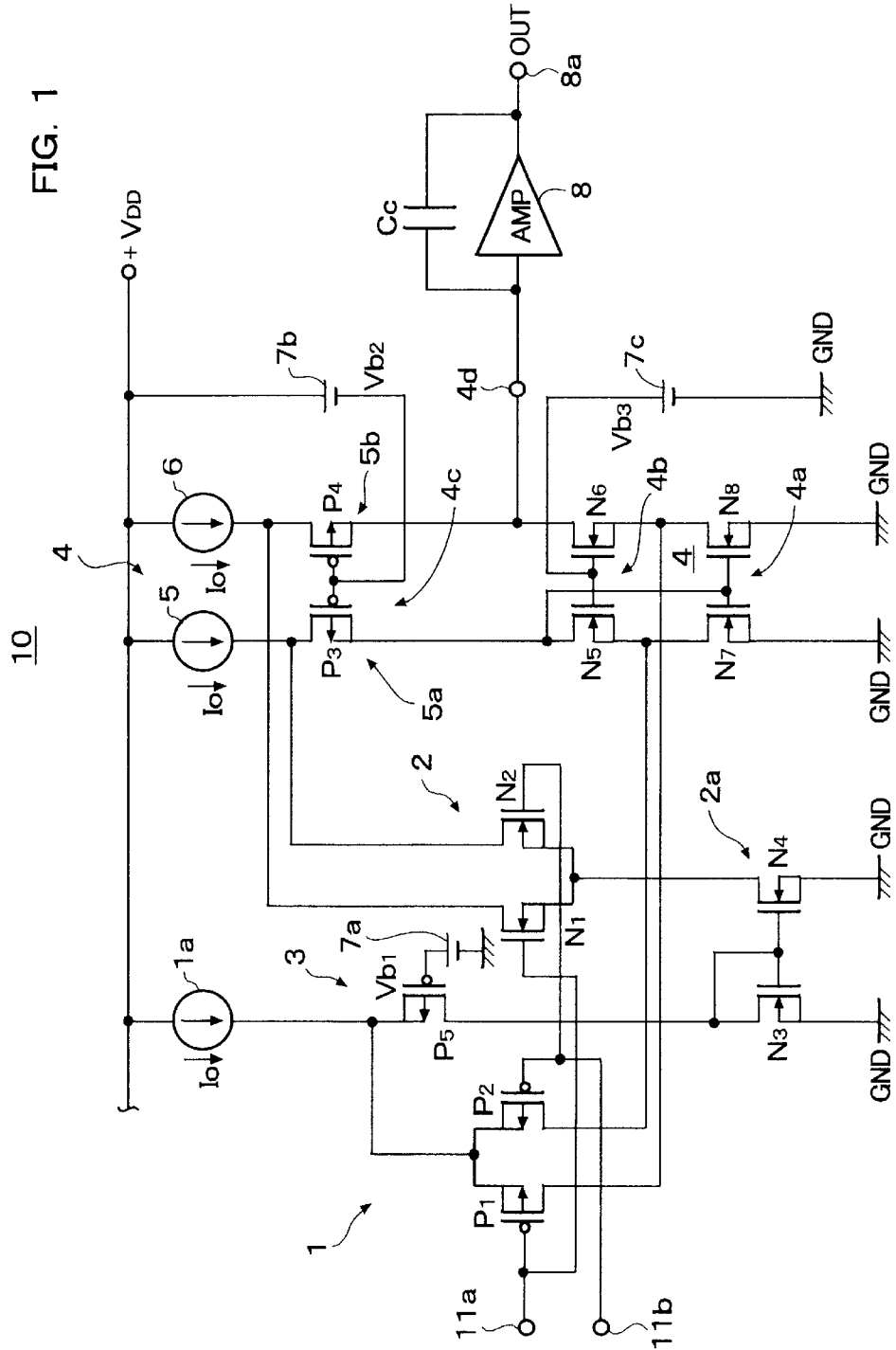
FIG. 1 is a block diagram of one embodiment of a CMOS operational amplifier circuit to which the present invention is applied.

A CMOS operational amplifier circuit 10 in FIG. 1 includes as its input stage differential amplifiers 1 and 2 each receives an input signal. The differential amplifier 1 includes at its upstream side a constant current source 1a and is constituted by P channel differential MOS transistors P1 and P2 which are connected to a power source line VDD via the constant current source 1a. The differential amplifier 2 includes at its downstream side a constant current source 2a and is constituted by N channel differential MOS transistors N1 and N2 which are connected to the ground GND via the constant current source 2a. Further, the CMOS operational amplifier circuit 10 is constituted by a change-over switch circuit 3, a cascode connected type current mirror circuit 4 which is formed by stacking two current mirror circuits 4a and 4b in vertical direction, current sources 5 and 6, other current sources 5a and 5b which are provided downstream these current sources 5 and 6 and located between the current mirror circuit 4b, bias circuits 7a, 7b and 7c and an output stage amplifier (AMP) 8.

Further, a capacitor Cc provided for the output stage amplifier 8 is a phase compensating capacitor, and 8a is an output terminal of the output stage amplifier 8. The respective input side transistors and output side transistors in the current sources 5a and 5b and current mirror circuits 4a and 4b are in a pair relation with each other and are respectively connected in series in vertical direction in the named order as above between the power source line VDD and the ground GND. Further, with the stacked two current sources 5 and 6 and 5a and 6b a cascode connected type constant current source is constituted. The current sources 5 and 6 supply a bias current to the current mirror circuit 4 as well as supply a bias current to the differential MOS transistors N1 and N2 in the differential amplifier 2 and serve as common current sources therefor.

The differential amplifier 1 is a P channel differential amplifier and operates when a bias current of Io is received from a constant current source 1a at the upstream, and the gate of the transistor P1 receives an input signal from a non-inverted input terminal (plus input) 11a. The operation range thereof is from GND to (VDD−Vth1), wherein Vth1 is a threshold voltage between source and gate of the P channel transistors P1 and P2. Further, 11b is an inverted input terminal (minus input) which is connected to the gate of the transistor P2.

Herein, when assuming that the current value of the constant current source 1a is as Io, the current value of the constant current sources 5 and 6 connected to the power source line VDD is also set to be Io.

The differential amplifier 2 is an N channel differential amplifier, and when a constant current source 2a thereof is under an operative state, the differential transistors N1 and N2 receive respectively a bias current having current of Io/2 from the upstream constant current sources 5 and 6 and operate, and the differential amplifier 2 causes to flow a bias current having current value of Io to the downstream constant current source 2a. The gate of the N channel transistor N1 receives the input signal from the non-inverted input terminal (plus input) 11a, and the operation range thereof is from (GND+Vth2) to VDD, wherein Vth2 is a threshold voltage between source and gate of the N channel transistors.

When synthesizing the outputs of these two differential amplifiers 1 and 2 by the stacked and cascode connected current mirror circuit 4, the operation range thereof is expanded in a range from GND to VDD, thereby a broad dynamic range can be realized.

The current mirror circuit 4 is a circuit formed by stacking the current mirror circuits 4a and 4b in this named order between the ground GND and the power source line VDD, and the current mirror circuit 4a is constituted by N channel MOS transistors N7 and N8 and the current mirror circuit 4b is constituted by N channel MOS transistors N5 and N6. Further, the current source 5a is constituted by a P channel MOS transistors P3 and the current source 5b is constituted by a P channel MOS transistor P4, and the bases of these transistors are connected in common.

The transistor P3 in the cascode connected current source 5a receives a bias current having current value Io (or when the differential amplifier is operated, current value Io/2) from the upstream constant current source 5 connected to the power source line VDD and is operated thereby, and the transistor P4 in the cascode connected current source 5b receives a bias current having current value Io (or when the differential amplifier is operated, current value of Io/2) and is operated thereby. Further, the bases of the transistors P3 and P4 are connected in common and receive a bias voltage Vb2 from a biasing circuit 7b. The transistors N5 and N6 in the current mirror circuit 4b provided downstream thereof receive bias currents from the respective corresponding upstream transistors P3 and P4 and cause the respective corresponding downstream transistors N7 and N8 to sink the currents. The bases of these transistors N5 and N6 are connected in common and are provided with a bias voltage Vb3 from a biasing circuit 7c.

Further, the gates of the transistors N7 and N8 in the current mirror circuit 4a are connected in common and are further connected to the drain side of the transistor N5, and further the respective drains thereof are connected to the respective corresponding drains of the transistors P1 and P2 in the differential amplifier 1 so that the transistors N7 and N8 operate as active loads for the differential amplifier 1. Thus, when the differential amplifier 1 is operating, both the bias current of the differential amplifier 1 and the bias currents from the current sources 5 and 6 flow into the transistors N7 and N8. Further, with the current mirror circuit 4b and the current source 5b a CMOS is constituted, and a junction of both drains of the transistor P4 in the current source 5b and the transistor N6 in the current mirror circuit 4b at their output side is connected to an output terminal 4d, and the CMOS is connected to the input of the output stage amplifier 8 via this output terminal 4d and the output stage amplifier 8 is driven by a current output signal from the current mirror circuit 4.

Since the differential amplifiers 1 and 2 perform an opposite inverting operation each other with respect to the input signal, in the current mirror circuit 4 the pair of transistors with the above connection and constituting the current mirror perform the inverting operation for the differential amplifier and the synthesized output of the differential amplifies 1 and 2 is taken out from the output terminal 4d of the current mirror circuit 4.

In the present embodiment, the constant current source 2a is constituted by the N channel MOS transistors N3 and N4, the drain of the transistor N4 at the output side of the current mirror is connected to the sources of the transistors N1 and N2 in common, and at the upstream of the transistor N3 at the input side of the current mirror the constant current source 1a for the differential amplifier 1 is provided. The constant current source 2a receives the bias current (current value Io) from the constant current source 1a via the source-drain of the P channel MOS transistor P5 when the same is turned ON.

The change-over switch circuit 3 is constituted by the transistor P5 and the gate thereof is connected to the biasing circuit 7a which applies the bias voltage Vb1 thereto. Thereby, the change-over switch circuit 3 performs a switch operation in response to the rising of the source voltage.

Namely, the bias voltage Vb1 corresponds to the voltage at the output side of the constant current source 1a when the voltage of the input signal of the differential amplifier 1 is entering or has entered into the dead zone voltage, and is set to turn ON the transistor P5 when the differential amplifier 1 is entering or has entered into the dead zone operation. The transistor P5 operates as a normally OFF switching element, and when the transistor P5 is in OFF state, the bias current Io of the current source 1a flows into the differential amplifier 1 constituted by the transistors P1 and P2. On the other hand, when the transistor P5 is turned ON or is in ON state, the bias current Io of the current source 1a flows into the input side transistor N3 in the current mirror circuit constituted by the transistors N3 and N4, and the output side mirror current flows into the transistor N4 of the constant current source 2a for the differential amplifier 2 constituted by the transistors N1 and N2 to form the bias current for the differential amplifier 2 and to operate the same. As a result, when the differential amplifier 1 is entering or has entered into the dead zone operation, the activation of the differential amplifier 1 is stopped and the differential amplifier 2 is activated to change-over the operation. On the contrary, when the voltage of the input signal for the differential amplifier 1 moves out from the dead zone voltage, the transistor P5 is turned OFF, thereby, the activation of the differential amplifier 2 is stopped and the differential amplifier 1 is activated to change-over the operation.

Through the change-over of the bias current from the differential amplifier 1 to the differential amplifier 2 or the opposite change-over thereof, the transistor P5 prevents the simultaneous activation of the two differential amplifiers 1 and 2 and constitutes a change-over circuit which selects either of the differential amplifiers.

In the present embodiment, as the biasing circuit 7a a comparator can be used. Such comparator is a circuit which compares the voltage of the input signal with the reference voltage (VDD−Vth1) and generates a change-over signal for turning ON the transistor P5, in that a circuit which generates the change-over signal for changing-over the operation from the differential amplifier 1 to the differential amplifier 2 or for changing-over the operation in the opposite direction.

Herein, when assuming that the transconductance Gm of the N channel differential amplifier 2 is GmN and the transconductance Gm of the P channel differential amplifier 1 is GmP, the transconductance Gm of the CMOS operational amplifier circuit 10 gives GmP by the operation of the differential amplifier 1 when the voltage of the input signal is in a range from OV to the voltage Vf at which the P channel differential amplifier 1 enters into the dead zone, and when the voltage of the input signal is in a range from dead zone voltage Vf of the P channel differential amplifier 1 to the voltage VDD of the power source line, the transconductance Gm thereof gives GmN by the operation of the N channel differential amplifier 2. Herein, since the difference between GmP and GmN is small, the CMOS operational amplifier circuit 10 can amplify the input signal with a high accuracy and since no large step is caused in the transconductance Gm, an optimum phase compensating capacitor Cc can be selected.

Moreover, the transconductances of GmP of the differential amplifier 1 constituted by the P channel transistors and GmN of the differential amplifier 2 constituted by the N channel transistors can be easily designed equal. In the present embodiment it is assumed that Gm of the differential amplifier 1 is substantially equal to Gm of the differential amplifier 2.

Since the Gm of the cascode connected type current mirror circuit 4 is proportional to the square root of the bias current ID of the cascode connected type current mirror circuit 4, it is desirable that the bias current ID flowing through the respective paired current mirror transistors is constant.

However, in FIG. 1 embodiment, the bias current ID in the cascode connected type current mirror circuit 4 constituted by the N channel transistors N5, N6, N7 and N8 varies depending on the change-over between the differential amplifiers 1 and 2. In other words, the bias current ID varies depending on the voltage of the input signal. Thereby, the transconductance Gm of the current mirror circuit 4 varies.

A CMOS operational amplifier circuit 20 in the following FIG. 2 embodiment can solve the above problem.

Figure 2:
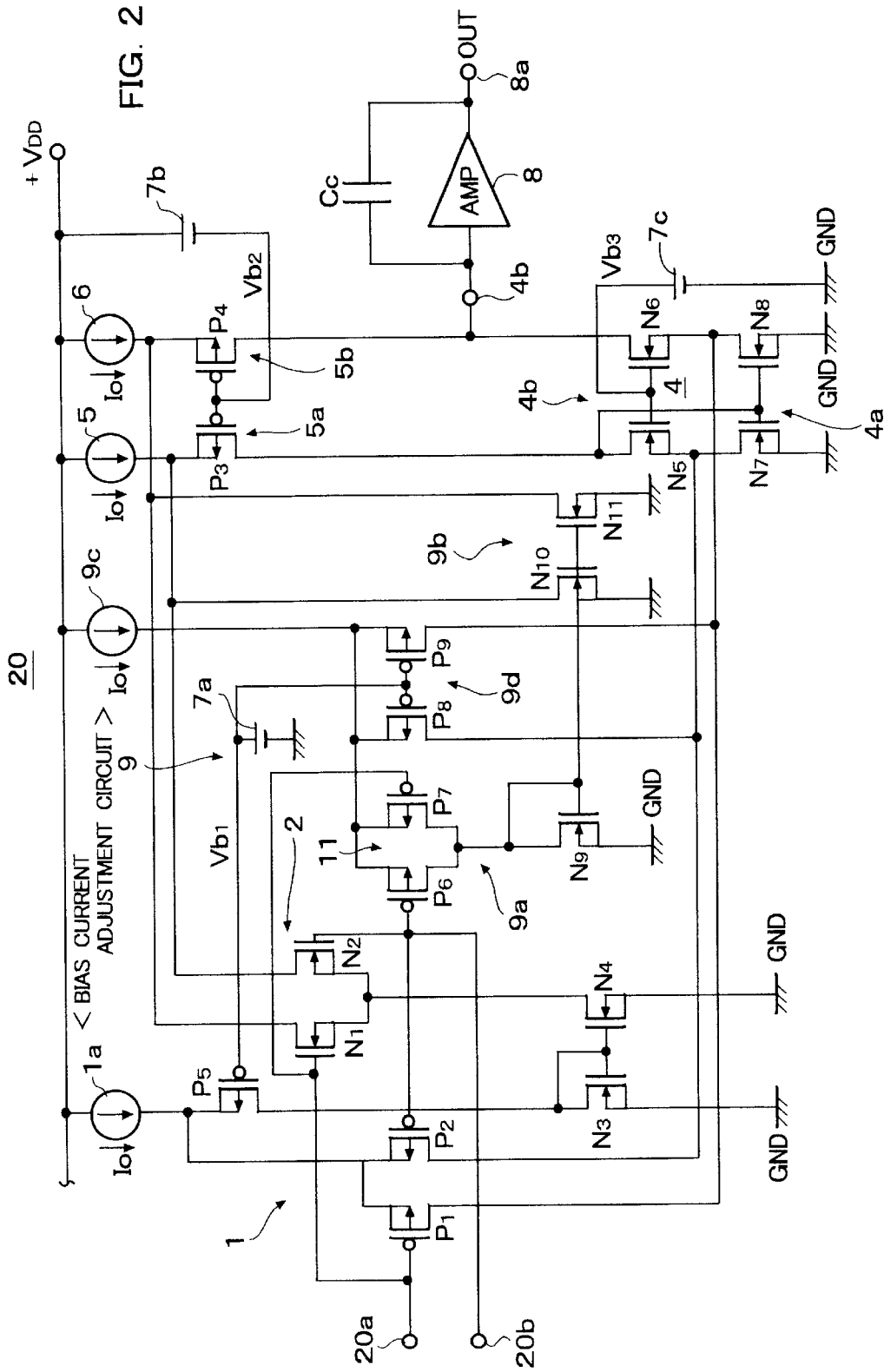
FIG. 2 is a block diagram of another embodiment of a CMOS operational amplifier circuit to which the present invention is applied.

The structural difference of FIG. 2 embodiment from that of FIG. 1 embodiment is a new provision of a bias current adjustment circuit 9 for the cascode connected current mirror circuit 4. The reason therefor, in FIG. 1 embodiment when the differential amplifier 1 in FIG. 1 is operating, the differential amplifier 1 applies current to the current mirror circuit 4 by flowing the bias current for causing to sink the operation current into the transistors N7 and N8 in the current mirror circuit 4 operating as a load for the differential amplifier 1. Thereby, the differential amplifier 1 inputs the current output signal depending on the input signal to the current mirror circuit 4.

On the other hand, when the differential amplifier 2 is operating, the differential amplifier 2 leads out current from the current mirror circuit 4 by taking out the operation current from a part of the current flowing through the transistors P3 and P4 of the current sources 5a and 5b connected in cascode with the current sources 5 and 6 of the current mirror circuit 4 operating as a load for the differential amplifier 2. Thereby, the differential amplifier 2 inputs the current output signal depending on the input signal to the current mirror circuit 4.

Namely, since the current mirror circuit 4 includes respective loads for the differential amplifiers 1 and 2 and the directions of the bias currents flowing through these loads differ each other, the bias current ID flowing through the current mirror circuits 4a and 4b when the differential amplifier 1 is activated (at this moment the differential amplifier 2 is not activated) differs from one when the differential amplifier 2 is activated. In order to keep the bias current constant the bias current adjustment circuit 9 is provided in the present embodiment, namely, the bias currents ID flowing through the current mirror circuits 4a and 4b are adjusted substantially equivalent when the operation is changed over from the differential amplifier 1 to the differential amplifier 2 as well as changed over in the opposite direction thereof.

The bias current adjustment circuit 9 is constituted by a dummy operation circuit 9a which performs an equivalent operation as the differential amplifier 1, a bias current producing circuit 9b which performs an equivalent operation as the differential amplifier 2 and produces a bias current, a constant current source 9c which generates a current having value Io equal to that of the constant current source 1a for the differential amplifier 1 and a change-over switch circuit 9d which performs a change-over operation at substantially the same moment as the change-over switch circuit 3 and produces an equivalent biasing operation current as the differential amplifier 1.

In the present embodiment, the bias current adjustment circuit 9 causes to operate the dummy operation circuit 9a at the same time when the differential amplifier 1 is operating, produces the same biasing operation current as the differential amplifier 2 and causes the current mirror circuit 4 to sink current corresponding to the biasing current. Thereby, the current mirror circuit 4 is placed under the same biasing current flowing condition when the differential amplifier 2 is operating.

Further, when the differential amplifier circuit 1 enters into the dead zone, the operation is changed over to the differential amplifier 2 to operate the same, however, at this moment, the bias current adjustment circuit 9 causes to operate the change-over switch circuit 9d (which performs the same operation as the change-over switch circuit 3) which stops the operation of the dummy operation circuit 9a and supplies the same biasing current as that of the differential amplifier 1 from the constant current source 9c via the change-over switch circuit 9d to the current mirror circuit 4. Thereby, the current mirror circuit 4 is placed under the same biasing current flowing condition when the differential amplifier 1 is operating.

The dummy operation circuit 9a is constituted by a differential amplifier 11 formed by P channel MOS transistors P6 and P7 of which source sides are connected in common to the constant current source 9c having the same current value of Io as the constant current source 1a and a current mirror connected input side transistor N9 which functions as an active load for the differential amplifier 11 and is provided downstream these transistors in common.

The constant current source 9c is connected to the power source line VDD as well as connected to the dummy operation circuit 9a and the change-over switch circuit 9d and supplies the biasing current Io either of them. The gates of the transistors P6 and P7 in the dummy operation circuit 9a are respectively connected to a non-inverted input terminal 20a and an inverted input terminal 20b in the like manner as the gates of the transistors P1 and P2 in the differential amplifier 1. The gates of the transistors N1 and N2 in the differential amplifier 2 are likely connected respectively to the non-inverted input terminal 20a and to the inverted input terminal 20b.

The bias current producing circuit 9b is constituted by output side N channel MOS transistors N10 and N11 connected in a current mirror with the transistor N9, and when the capacity ratio or the W/L ratio of these transistors is selected ½ of that with respect to the transistor N9, a sink current of Io/2 can be produced. The drain sides of the transistors N10 and N11 are connected to the current sources 5 and 6 and the respective source sides thereof are connected to the ground GND. Thereby, when the differential amplifier 1 is operating, the transistors sink current of Io/2 from the current source 5 and 6. The value Io/2 of the sink current corresponds to the respective biasing currents of Io/2 of the paired differential transistors N1 and N2 in the differential amplifier 2. Namely, the combination of the dummy operation circuit 9a and the bias current producing circuit 9b constitutes the second bias current producing circuit according to the second aspect of the present invention which produces a bias current having the value corresponding to the bias current value of the differential amplifier 2 when the differential amplifier 1 is operating.

The change-over switch circuit 9d is constituted by P channel MOS transistors P8 and P9, is a like switch circuit as the transistor P5 and is formed as an equivalent transistor (paired transistors). The respective gates thereof are connected in common and receive voltage Vb1 from the biasing circuit 7a like the transistor P5. Thereby, the three transistors P5, P8 and P9 turn ON/OFF at the same time.

The sources of the transistors P8 and P9 are connected to the constant current source 9c in common, the drain of the transistor P8 is connected to the drain of the transistor N7 in the current mirror circuit 4 and the drain of the transistor N9 is connected to the drain of the transistor N8 in the current mirror circuit 4.

The transistors P8 and P9 in the change-over switch circuit 9d turn ON at the same time with the transistor P5, when the differential amplifier 1 is put into the dead zone operation. At this moment the transistors P8 and P9 receive the current having value of Io from the constant current source 9c provided at the upstream and connected to the power source line VDD and each of which flows out the current of Io/2 to the downstream transistors N7 and N8 in the current mirror circuit 4 as their biasing current. Namely, in the present embodiment, the change-over switch circuit 9d itself functions as a circuit which produces respective biasing currents of Io/2 for the paired differential transistors P1 and P2 in the differential amplifier 1. In other words, combination of the constant current source 9c and the change-over switch circuit 9d constitutes the first bias current producing circuit according to the second aspect of the present invention which produces a biasing current having the value corresponding to the biasing current value of the differential amplifier 1.

Thereby, when the differential amplifier 1 is operating (in this moment the differential amplifier 2 is not operating), the dummy operation circuit 9a operates at the same time, and since the current of Io/2 is sinked by the transistors N10 and N11 as the bias operation current from the current sources 5 and 6, the biasing current ID flowing through the transistors in the current mirror circuit 4 which is the same current value when the differential amplifier 2 is operating is supplied to the current mirror circuits 4a and 4b from the upstream thereof.

On the other hand, when the operation of the differential amplifier 1 is stopped and the differential amplifier 2 is operating, the P channel MOS transistors P8 and P9 are shifted from OFF to ON, the operation of the dummy operation circuit 9a is also stopped, the current Io/2 serving as the biasing operation current is sinked from the constant current source 9c flowing the same amount of current as the constant source 1a by the transistors P8 and P9, the same amount of current flows in into the downstream transistors N7 and N8 in the current mirror circuit 4 and the same biasing operation circuit Io/2 when the differential amplifier 1 would have been operating is supplied to the current mirror circuit 4a.

As a result, when either one of the differential amplifier 1 and the differential amplifier 2 is operated, the biasing current ID flowing through the respective transistors in a current mirror pair in the current mirror circuits 4a and 4b never varies.

As has been explained hitherto, the biasing circuit 7a of the present embodiment is a circuit which generates a change-over signal. Therefore, in place of the biasing circuit 7a a comparator can be used which compares the voltage of the input signal with the reference voltage (VDD−Uth1) and generates a change-over signal for turning ON the transistor P5. When using such comparator, the change-over switch circuit 9d in the bias current adjustment circuit 9 of the present embodiment can also be designed to be operated by the change-over signal of the comparator. Further, in this instance, the dummy operation circuit 9a which performs the equivalent operation as the differential amplifier 1 can be replaced by a bias current producing circuit which simply produces or sinks the equivalent bias current as the differential amplifier 1.

Further, when the first bias current producing circuit which flows the first current having the value corresponding to the bias current value of the differential transistors in the first differential amplifier 1 is designed to be changed-over depending on the change-over signal of the comparator to the second bias current producing circuit which flows the second current having the value corresponding to the bias current value of the differential transistors in the second differential amplifier 2, the change-over switch circuit 9d is unnecessitated.

What is claimed is:

1. A CMOS operational amplifier circuit comprising a first differential amplifier having differential MOS transistors of one of P channel and N channel which receive an input signal and a second differential amplifier having differential MOS transistors of the other of P channel and N channel which receive the input signal and generates an output signal depending on the input signal in response to an output of these differential amplifiers, characterized in that the CMOS operational amplifier circuit further comprises:

a current mirror circuit which receives respective current output signals of the first and second differential amplifiers and generates a current output signal depending on the current values of the respective current output signals;

an output circuit which receives the output signal of the current mirror circuit and generates an output signal depending on the input signal;

a change-over circuit for causing operation change-over which causes the first differential amplifier to stop operation when the first differential amplifier is entering or has been entered into a dead zone operation region with respect to the input signal and causes the second differential amplifier to perform operation;

wherein the change-over circuit performs operation changing over in which the operation of the second differential amplifier is stopped and the first differential amplifier is operated when the first differential amplifier moves out from the dead zone operation region;

wherein the first differential amplifier includes a first current source which flows an operation current for the own differential MOS transistors, the second differential amplifier includes a second current source which flows an operation current for the own differential MOS transistors, and the change-over circuit is a circuit for dividing current from the first current source, stops the operation of the first differential amplifier and operates the second differential amplifier by dividing all of the current from the first current source, and contrary operates the first differential amplifier and stops the operation of the second differential amplifier by flowing all of the current from the first current source to the first differential amplifier;

wherein the change-over circuit is a MOS transistor of which gate is connected to a predetermined voltage line corresponding to a voltage covering the dead zone operation region and of which source or drain is connected to the first current source;

wherein the differential MOS transistor in the first differential amplifier is a P channel MOS transistor, the differential MOS transistor in the second differential amplifier is an N channel MOS transistor, the transconductances Gm of the first and second differential amplifiers are substantially the same, the first and second current sources are constant current sources, the MOS transistor in the change-over circuit is a P channel and of which source is connected to the first current source changes over from OFF to ON when the first differential amplifier is entering or has entered into the dead zone operation region with respect to the input signal, causes to flow out all of the current from the first current source from the drain via the source thereof and causes to flow a current of the second current source depending on the amount of the divided current from the drain of the MOS transistor in the change-over circuit to operate the second differential amplifier;

further comprises third and fourth constant current sources, the current mirror circuit is a vertically cascade connected circuit which is formed by stacking vertically a plurality of current mirrors between a power source line and the ground, of which input side transistor is connected via the third constant current source to the power source line and of which output side transistor is connected via the fourth constant current source to the power source line; and wherein the first differential amplifier takes the current mirror at the ground line side as its load among the plurality of current mirrors in the current mirror circuit and the second differential amplifier takes the third and fourth constant current sources as its load.

2. A CMOS operational amplifier circuit according to claim 1, further comprises a bias current flowing circuit which flows out a first current having the value corresponding to the bias current value of the differential transistor in the first differential amplifier, and a bias current sink circuit which sinks a second current having the value corresponding to the bias current value of the differential transistor in the second differential amplifier, wherein the change-over circuit causes to flow the current having the second current value from the third and fourth constant current sources to the bias current sink circuit when the first differential amplifier is operating and further causes to flow the current having the first current value from the bias current flow circuit to the current mirror at the side of the ground line after stopping the current having the second current value when the operation of the first differential amplifier is stopped.

3. A CMOS operational amplifier circuit comprising a first differential amplifier having differential MOS transistors of one of P channel and N channel which receive an input signal and a second differential amplifier having differential MOS transistors of the other of P channel and N channel which receive the input signal and generates an output signal depending on the input signal in response to an output of these differential amplifiers, characterized in that the CMOS operational amplifier circuit further comprises:

a current mirror circuit which receives respective current output signals of the first and second differential amplifiers and generates a current output signal depending on the current values of the respective current output signals;

an output circuit which receives the output signal of the current mirror circuit and generates an output signal depending on the input signal;

a change-over circuit for causing operation change-over which causes the first differential amplifier to stop operation when the first differential amplifier is entering or has been entered into a dead zone operation region with respect to the input signal and causes the second differential amplifier to perform operation; and further comprises a first bias current producing circuit which causes to flow a first current having the value corresponding to a bias current value of a differential transistor in the first differential amplifier and a second bias current producing circuit which causes to flow a second current having the value corresponding to a bias current value of a differential transistor in the second differential amplifier, wherein when the bias current flowing through the differential transistor in the first differential amplifier is caused to flow through or to be sinked in the current mirror circuit and when the bias current flowing through the differential transistor in the second differential amplifier is caused to flow through or to be sinked into the current mirror circuit, the current output signals of the first and second differential amplifiers are inputted, and the change-over circuit causes, when the first differential amplifier is operating, to flow the second current value from the second bias current producing circuit to the current mirror circuit or to sink the same from the current mirror circuit and when the operation of the first differential amplifier is stopped, the change-over circuit causes to stop the second current value and causes to flow the first current value from the first bias current producing circuit to the current mirror circuit or causes to sink the same from the current mirror circuit.

4. A CMOS operational amplifier circuit according to claim 3, wherein the change-over circuit performs operation changing over in which the operation of the second differential amplifier is stopped and the first differential amplifier is operated when the first differential amplifier moves out from the dead zone operation region.

5. A CMOS operational amplifier circuit according to claim 4, wherein the first differential amplifier includes a first current source which flows an operation current for the own differential MOS transistors, the second differential amplifier includes a second current source which flows an operation current for the own differential MOS transistors, and the change-over circuit includes a first change-over circuit for dividing current from the first current source, a second change-over circuit which selectively operates either the first or the second bias current producing circuit and the first change-over circuit stops the operation of the first differential amplifier and operates the second differential amplifier by dividing all of the current from the first current source.

6. A CMOS operational amplifier circuit according to claim 5, further comprising a third and a fourth constant current source, wherein the differential MOS transistor in the first differential amplifier is a P channel MOS transistor, the differential MOS transistor in the second differential amplifier is an N channel MOS transistor, the transconductances Gm of the first and second differential amplifiers are substantially the same, and the current mirror circuit is a vertically cascade connected circuit which is formed by stacking vertically a plurality of current mirrors between a power source line and the ground, of which input side transistor is connected via the third constant current source to the power source line and of which output side transistor is connected via the fourth constant current source to the power source line.

7. A CMOS operational amplifier circuit according to claim 6, wherein the first bias current producing circuit is a current flowing out circuit which flows out the biasing current to the current mirror circuit, and the second bias current producing circuit is a biasing current sink circuit which sinks a current from the third and fourth constant current sources in the current mirror circuit.

8. A CMOS operational amplifier circuit according to claim 7, further comprises a fifth constant current source which generates a current having the value substantially equal to the current value of the first constant current source, wherein the first change-over circuit stops the operation of the first differential amplifier and causes to operate the second differential amplifier circuit by dividing all of the current from the first constant current source, and contrary causes to operate the first differential amplifier and stops the operation of the second differential amplifier circuit by flowing all of the current from the first constant current source to the MOS transistor in the first differential amplifier circuit, the second change-over circuit, through substantially the simultaneous operation with the first change-over circuit, causes to operate the biasing current sink circuit and stops the operation of bias current flowing out circuit by flowing all of the current from the fifth constant current source to the biasing current sink circuit, and contrary causes to operate the bias current flowing out circuit and stops operation of the biasing current sink circuit by flowing all of the current from the fifth constant current source to the biasing current flowing out circuit.

9. A CMOS operational amplifier circuit according to claim 8, wherein the current mirror circuit is a first current mirror circuit, wherein the biasing current sink circuit includes a circuit which is connected to the fifth constant current source and performs a dummy operation equivalent to the first differential amplifier and a second current mirror circuit is connected to the third and fourth constant current sources.

10. A CMOS operational amplifier circuit according to claim 9, wherein the first differential amplifier takes a current mirror at the ground line side as its load among the plurality of current mirrors of the first current mirror in the current mirror circuit and the second differential amplifier takes the third and fourth constant current sources as its load.

* * * * *